United States Patent [19]

Lin

[11] Patent Number: 5,594,609

[45] Date of Patent: Jan. 14, 1997

[54] THERMOELECTRIC COUPLE DEVICE

[76] Inventor: Wei T. Lin, No. 20, Sec. 5, 3rd Fl., Cheng Teh Rd., Taipei, Taiwan

[21] Appl. No.: 334,550

[22] Filed: Nov. 4, 1994

[30] Foreign Application Priority Data

Apr. 23, 1994 [CN] China .................................. 94209356.9

[51] Int. Cl.⁶ ..................................................... H02H 5/04
[52] U.S. Cl. ............................. 361/104; 361/103; 62/3.2; 136/225
[58] Field of Search ................................... 361/103–106, 361/23–27; 62/3.2–3.6; 136/223, 225, 228–229

[56] References Cited

U.S. PATENT DOCUMENTS

| | | | |
|---|---|---|---|
| 3,726,100 | 4/1973 | Widakowich | 62/3 |
| 5,132,868 | 7/1992 | Clower et al. | 361/103 |
| 5,156,004 | 10/1992 | Wu et al. | 62/3.1 |

Primary Examiner—Jeffrey A. Gaffin
Assistant Examiner—Michael J. Sherry
Attorney, Agent, or Firm—Merchant, Gould, Smith, Edell, Welter & Schmidt, P.A.

[57] ABSTRACT

A thermoelectric couple device including a thermoelectric couple consisting of a first aluminum oxide base plate, a second aluminum oxide base plate, a plurality of copper foils respectively welded to the first and second aluminum oxide base plates, and a plurality of N type thermoelectric semiconductors, and P type thermoelectric semiconductors respectively welded to the copper foils between the first and second aluminum oxide base plates and alternatively connected in series; and a temperature detecting device mounted on the first aluminum oxide base plate and disposed between the first and second aluminum oxide base plates to detect the inside temperature of the thermoelectric couple.

7 Claims, 6 Drawing Sheets

5,594,609

THERMOELECTRIC COUPLE DEVICE

BACKGROUND OF THE INVENTION

The present invention relates to a thermoelectric couple, and relates more particularly to such a thermoelectric couple having a temperature detecting device on the inside.

The techniques of using thermoelectric couples to reduce temperature are well known and intensively used in the production of a variety of consumer goods including refrigerators and dehumidifiers. Thermoelectric couples are employed for reducing the temperature of a computer's central processor unit (CPU). However, when a thermoelectric couple is directly mounted on a CPU to continuously reduce its temperature, the operation of the CPU may be affected, causing an operation error. In order to eliminate this problem, a thermoresistor may be used and installed between the CPU and the thermoelectric couple to control the operation of the thermoelectric couple according to the value of the temperature detected. Because the thermoelectric couple is thin (normally about 4 mm to 8 mm), it is difficult to install a thermoresistor between the thermoelectric couple and the CPU. Furthermore, the installation of an external thermoresistor complicates the mounting procedure and greatly increases the installation cost and mounting space of the thermoelectric couple. Furthermore, this arrangement will limits the application of the thermoelectric couple.

SUMMARY OF THE INVENTION

The present invention has been accomplished under the circumstances in view. It is one object of the present invention to provide a thermoelectric couple device which eliminates the aforesaid drawbacks. It is another object of the present invention to provide a thermoelectric couple device which needs a small installation space. It is still another object of the present invention to provide a thermoelectric couple device which provides a broad application range. It is still another object of the present invention to provide a thermoelectric couple device which is inexpensive to manufacture. It is still another object of the present invention to provide a thermoelectric couple device which is stable in use. It is still another object of the present invention to provide a thermoelectric couple device which is inexpensive to install. It is still another object of the present invention to provide a thermoelectric couple device which provides an overheat protection. It is still another object of the present invention to provide a thermoelectric couple device which provides overcurrent protection. It is still another object of the present invention to provide a thermoelectric couple device which operates automatically according to a predetermined temperature value.

According to one aspect of the present invention, the thermoelectric couple device comprises a thermoelectric couple consisting of a first aluminum oxide base plate, a second aluminum oxide base plate, a plurality of copper foils respectively welded to the first and second aluminum oxide base plates, and a plurality of N type thermoelectric semiconductors and P type thermoelectric semiconductors respectively welded to the copper foils between the first and second aluminum oxide base plates and alternatively connected in series; and a temperature detecting device mounted on the first aluminum oxide base plate and disposed between the first and second aluminum oxide base plates to detect the inside temperature of the thermoelectric couple.

According to another aspect of the present invention, a normal-open thermal switch is mounted on one aluminum oxide base plate inside the thermoelectric couple and connected in series to the N type and P type thermoelectric semiconductors to automatically start the thermoelectric couple when the inside temperature of the thermoelectric couple surpasses a predetermined value.

According to still another aspect of the present invention, a normal-close thermal switch is mounted on one aluminum oxide base plate inside the thermoelectric couple and connected in series to the N type and P type thermoelectric semiconductors to automatically cut off the power supply from the thermoelectric couple when the temperature inside the thermoelectric couple drops below a predetermined value.

According to still another aspect of the present invention, a miniature non-fuse switch is mounted on one aluminum oxide base plate inside the thermoelectric couple and connected in series to the N type and P type thermoelectric semiconductors to automatically cut off the power supply from the thermoelectric couple when the current of the electricity surpasses a predetermined value.

DETAILED DESCRIPTION OF THE PREFERRED EMBODIMENT

Figure 1:
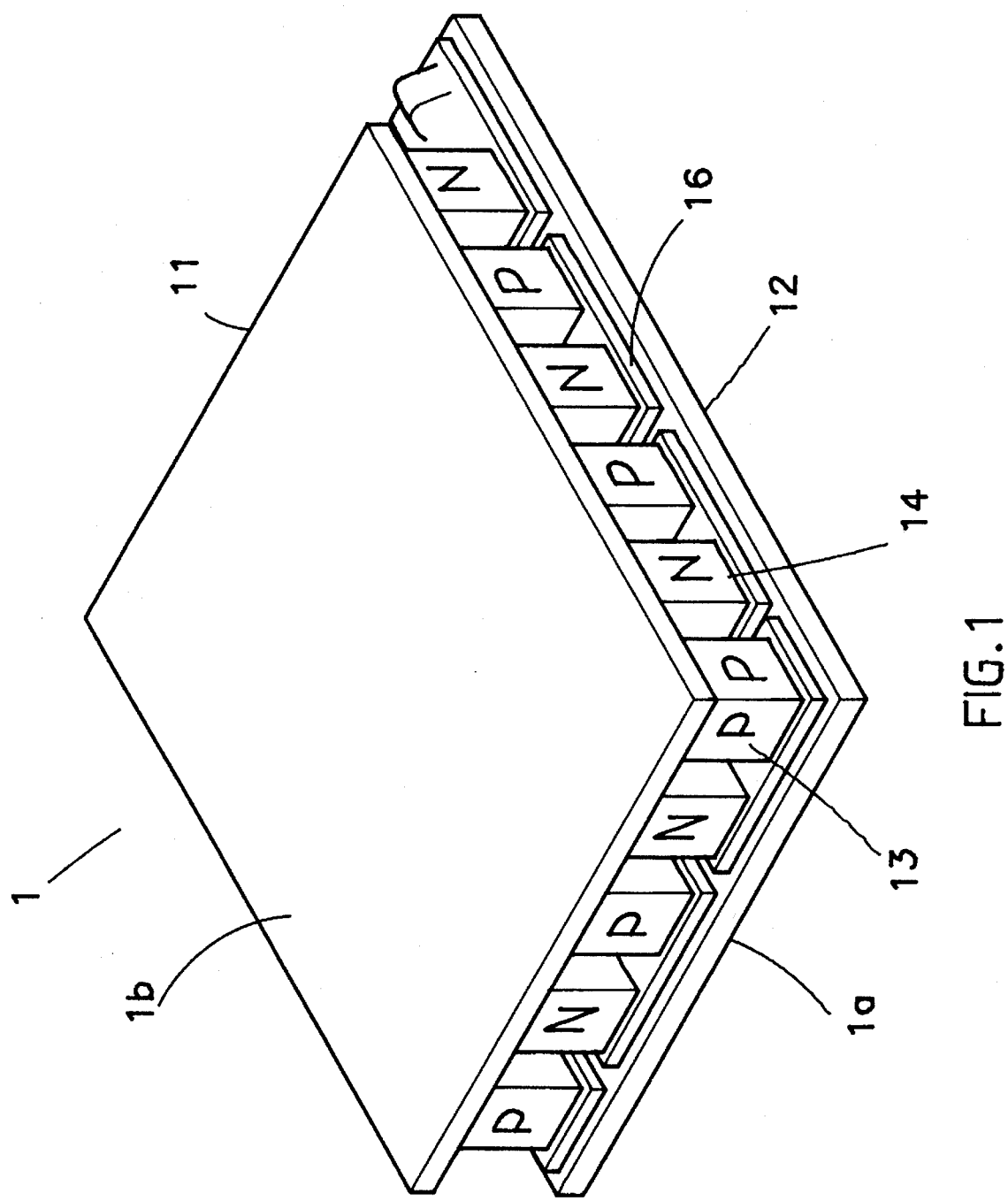
FIG. 1 is an elevational view of a thermoelectric couple device according to the present invention.
Figure 2:
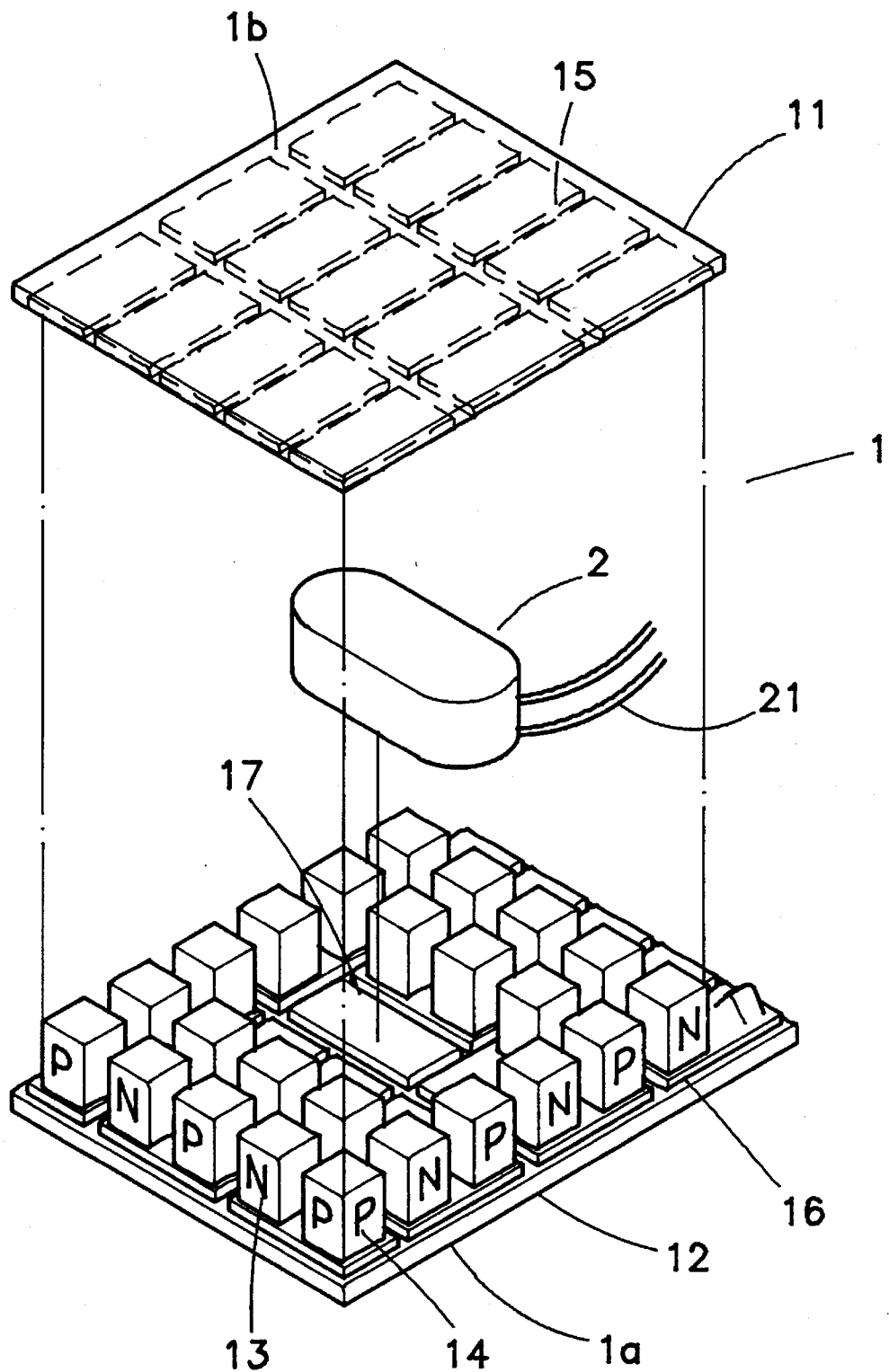
FIG. 2 is an exploded view of the thermoelectric couple device shown in FIG. 1.
Figure 3:
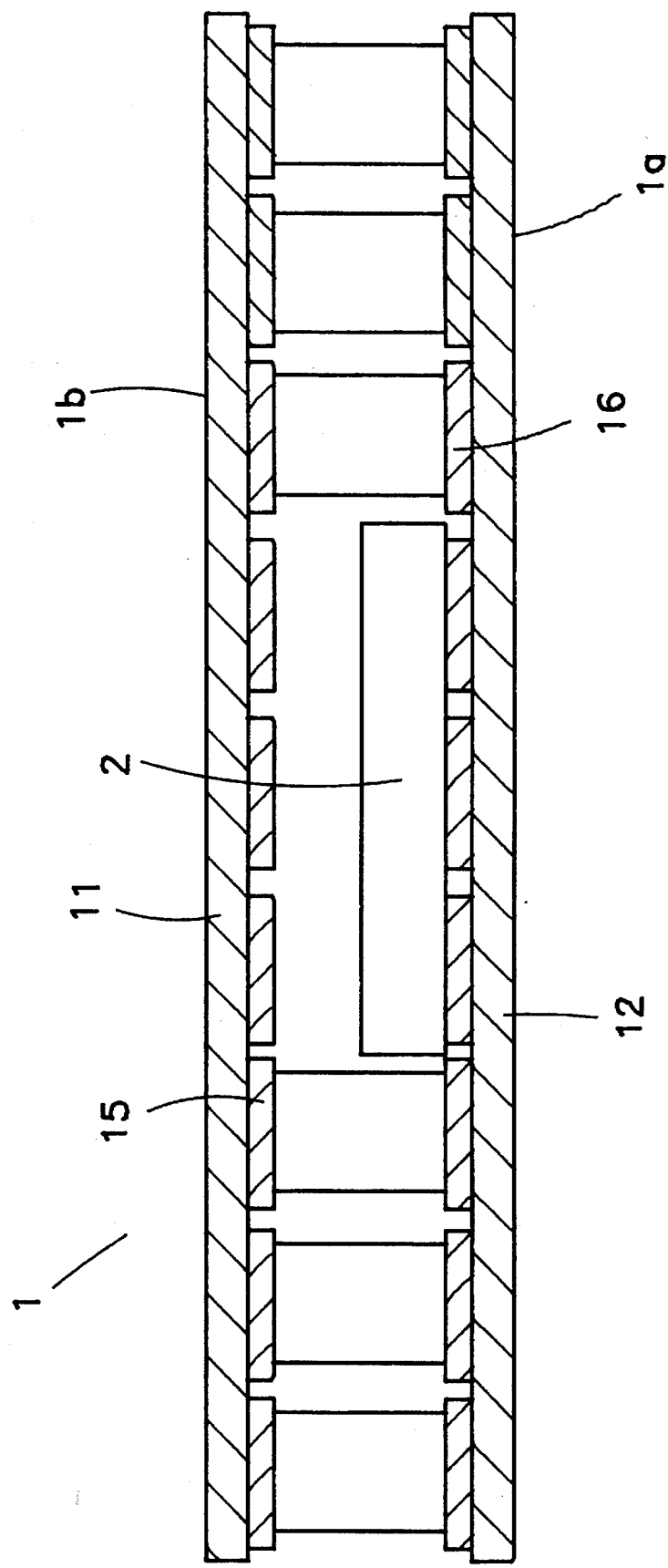
FIG. 3 is a plain view in section of the thermoelectric couple device shown in FIG. 1.

Referring to FIGS. 1, 2, and 3, a thermoelectric couple device in accordance with the present invention comprises a thermoelectric couple 1 and a temperature detecting device 2 (labelled as "TEMP DETECT"). The thermoelectric couple 1 comprises two opposing aluminum oxide base plates 11 and 12 for the cold side 1b and the hot side 1a respectively. Copper foils 15 and 16 are respectively welded to the aluminum oxide base plates 11 and 12, and then pairs of thermoelectric semiconductors 13 and 14 are respectively welded to the copper foils 15 and 16 and connected between the aluminum oxide base plates 11 and 12. Each pair of thermoelectric semiconductors 13 and 14 include a N type thermoelectric semiconductor 13 and a P type thermoelectric semiconductor 14. When the thermoelectric semiconductors 13 and 14 are welded to the copper foils 15 and 16 and connected between the aluminum oxide base plates 11 and 12, the N type thermoelectric semiconductors 13 and the P type thermoelectric semiconductors 14 are alternatively connected in series. Furthermore, a space 17 is left between the aluminum oxide base plates 11 and 12 for mounting the temperature detecting device 2 before the installation of the thermoelectric semiconductors 13 and 14. A copper foil 15 or 16 may be welded to one aluminum oxide base plate 11 or 12 at the location of the space 17 for the positioning of the temperature detecting device 2, permitting the contact legs 21 of the temperature detecting device 2 to be guided out for connection to an external circuit. The temperature detecting device 2 disposed between the aluminum oxide plates 11 and 12 detects the inside temperature of the thermoelectric couple.

Because aluminum oxide base plates 11 and 12 have the properties of high heat conductivity and low electricity conductivity, they serve as the parallel media for the heat passage of the thermoelectric semiconductors 13 and 14 while the copper foils 15 and 16 form the series media of the heat passage of the thermoelectric semiconductors 13 and 14. The aluminum oxide plates 11 and 12 may operate respectively as hot 1a and cold 1b plates or respectively as cold 1b and hot 1a plates.

Figure 4:
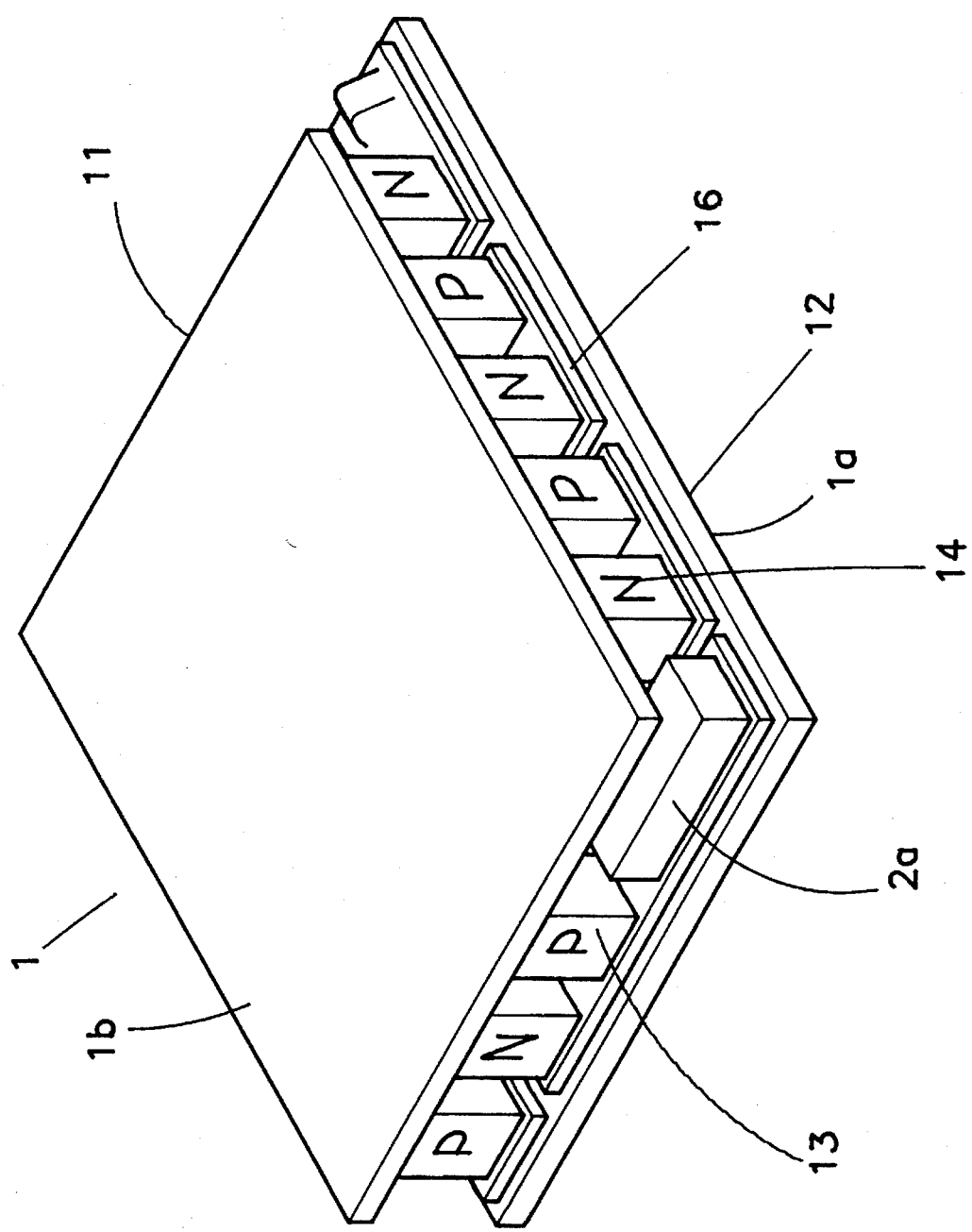
FIG. 4 shows an alternate form of the present invention.
Figure 5:
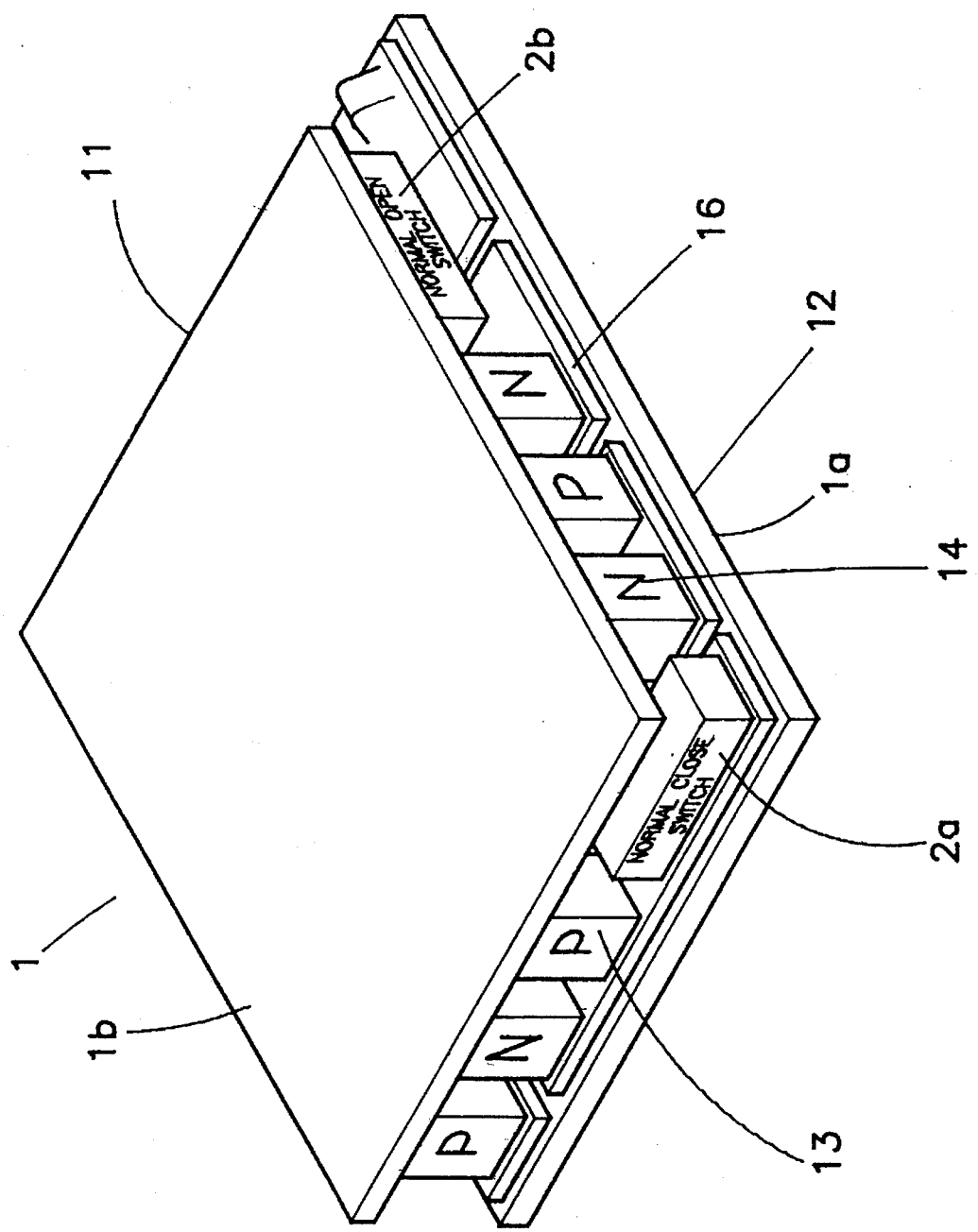
FIG. 5 shows an alternate form of the present invention.

FIG. 4 shows an alternate form of the present invention. In addition to the aforesaid temperature detecting device 2, a thermoelectric switch 2a may be installed and connected in series to the thermoelectric semiconductors 13 and 14. For example, a normal-open thermal switch (alternate embodiment of 2a) may be mounted at the cold side 1b and connected in series to the N type and P type thermoelectric semiconductors to automatically turn on the thermoelectric couple 1 when the inside temperature surpasses a predetermined value, or a normal-close thermal switch (further alternate embodiment of 2a) may be mounted at the hot side 1a and connected in series to the N type and P type thermoelectric semiconductors to automatically cut off power supply from the thermoelectric couple 1 when the inside temperature drops below a predetermined value, or a miniature non-fuse switch (further alternate embodiment of 2a) may be mounted inside the thermoelectric couple 1 and connected in series to the thermoelectric semiconductors 13 and 14 for overcurrent protection. FIG. 5 illustrates a thermoelectric couple device having a normal-open switch 2b mounted on the first base plate 11 and a normal-close switch 2c mounted on the second base plate 12, each switch 2b and 2c mounted in series with the P type and N type thermoelectric semiconductors. Normal open thermal switch 2b provides for automatically starting the thermoelectric couple when the interior temperature of the couple surpasses a first predetermined temperature and normal-close switch 2c provides for automatically deactivating the couple when the interior temperature falls below a second predetermined temperature.

What is claimed is:

1. A thermoelectric couple device comprising:

a thermoelectric couple comprising a first ceramic base plate, a second ceramic base plate, a plurality of copper foils respectively welded to said first and second ceramic base plates, and a first plurality of N type thermoelectric semiconductors and a second plurality of P type thermoelectric semiconductors respectively welded to said copper foils between said first and second ceramic base plates, wherein N type thermoelectric semiconductors of said first plurality of N type thermoelectric semiconductors and P type thermoelectric semiconductors of said second plurality of P type thermoelectric semiconductors being alternately connected in series; and a temperature detecting device mounted on said first ceramic base plate and disposed between said first and second ceramic base plates to detect an interior temperature of said thermoelectric couple.

2. The thermoelectric couple device of claim 1 further comprising a normal-open thermal switch mounted on said first ceramic base plate inside said thermoelectric couple and connected in series to said first plurality of N type thermoelectric semiconductors and said second plurality of P type thermoelectric semiconductors to automatically start said thermoelectric couple when the interior temperature of said thermoelectric couple surpasses a first predetermined temperature, and a normal-close thermal switch mounted on said second ceramic base plate inside said thermoelectric couple and connected in series to said N type and P type thermoelectric semiconductors to automatically deactivate said thermoelectric couple when the interior temperature of said thermoelectric couple drops below a second predetermined temperature.

3. The thermoelectric couple device of claim 1 further comprising a miniature non-fuse switch mounted on said first ceramic base plate inside said thermoelectric couple and connected in series to said first plurality of N type thermoelectric semiconductors and said second plurality of P type thermoelectric semiconductors to automatically deactivate said thermoelectric couple when an electric current passing through said non-fuse switch surpasses a predetermined current value.

4. The thermoelectric couple device of claim 1 wherein said first ceramic base plate is a hot side, and said second ceramic base plate is a cold side.

5. The thermoelectric couple device of claim 1 wherein said first ceramic base plate is a cold side, and said second ceramic base plate is a hot side.

6. The thermoelectric couple device of claim 1 wherein the first ceramic base plate and the second ceramic base plate are formed from aluminum oxide.

7. A thermoelectric couple device comprising:

a thermoelectric couple comprising a first thermally conducting base plate, a second thermally conducting base plate, a plurality of copper foils respectively welded to said first and second thermally conducting base plates, and a first plurality of N type thermoelectric semiconductors and a second plurality of P type thermoelectric semiconductors respectively welded to said copper foils between said first and second thermally conducting base plates, the members of said first and second pluralities being alternately connected in series; and a temperature detecting device mounted on said first thermally conducting base plate and disposed between said first and second thermally conducting base plates to detect an interior temperature of said thermoelectric couple.

* * * * *

UNITED STATES PATENT AND TRADEMARK OFFICE
CERTIFICATE OF CORRECTION

PATENT NO. : 5,594,609

DATED : January 14, 1997

INVENTOR(S) : Wei T. Lin

It is certified that error appears in the above-indentified patent and that said Letters Patent is hereby corrected as shown below:

Col. 1, line 27: delete "will" after the word "arrangement"

Col. 2, line 34: insert --depicting a non-fuse switch mounted inside the thermocouple-- after word "invention;"

Col. 2, line 35: delete "." after the word "invention"

Figure 6:
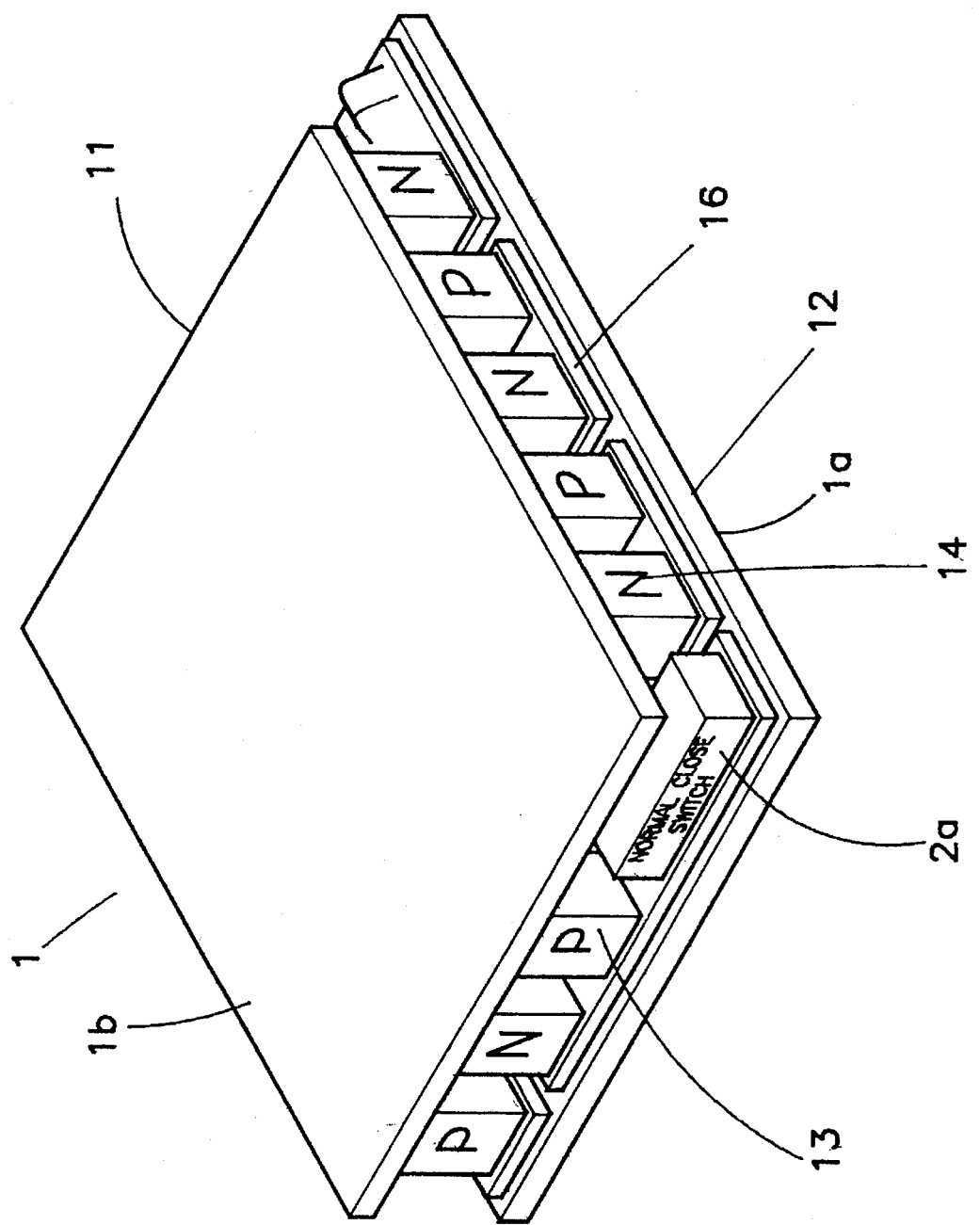

Col. 2, line 36: insert --depicting a normal open switch on the upper plate and a normal se switch on the lower plate; and
Fig. 6 shows an alternate form of the present invention depicting a normal close switch unted inside the thermoelectric couple device.-- after the word "invention"

UNITED STATES PATENT AND TRADEMARK OFFICE
CERTIFICATE OF CORRECTION

PATENT NO.  : 5,594,609
DATED       : January 14, 1997
INVENTOR(S) : Wei T. Lin

It is certified that error appears in the above-indentified patent and that said Letters Patent is hereby corrected as shown below:

Col. 3, line 42: insert --Figure 6 illustrates a thermoelectric couple device 1 having a mal-close switch 2a mounted on the second base plate 12, the normal-close switch 2a mounted in es with the P type and N type thermoelectric semiconductors 13 and 14. The normal-close tch 2a provides for automatically deactivating the thermoelectric couple device 1 when the :rior temperature falls below a predetermined cut-off temperature.-- after the word "temperature."

Signed and Sealed this

Eighteenth Day of November 1997

BRUCE LEHMAN

Attesting Officer

Commissioner of Patents and Trademarks